United States Patent
Nurikabe et al.

(10) Patent No.: US 9,461,619 B2
(45) Date of Patent: Oct. 4, 2016

(54) HIGH-FREQUENCY MODULE

(71) Applicant: Murata Manufacturing Co., Ltd., Nagaokakyo-shi, Kyoto-fu (JP)

(72) Inventors: Yuji Nurikabe, Nagaokakyo (JP); Hiromichi Kitajima, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 162 days.

(21) Appl. No.: 14/169,552

(22) Filed: Jan. 31, 2014

(65) Prior Publication Data

US 2014/0218127 A1    Aug. 7, 2014

(30) Foreign Application Priority Data

Feb. 6, 2013  (JP) ................. 2013-021000

(51) Int. Cl.
| | |
|---|---|
| *H03H 9/72* | (2006.01) |
| *H03H 7/38* | (2006.01) |
| *H03H 9/70* | (2006.01) |
| *H03H 9/02* | (2006.01) |

(52) U.S. Cl.
CPC .............. *H03H 9/725* (2013.01); *H03H 7/38* (2013.01); *H03H 9/02574* (2013.01); *H03H 9/706* (2013.01); *H03H 9/72* (2013.01)

(58) Field of Classification Search
CPC .... H03H 7/38; H03H 9/02574; H03H 9/725; H03H 9/706
USPC ............ 333/133, 187, 188, 193–196; 455/83
See application file for complete search history.

(56) References Cited

U.S. PATENT DOCUMENTS

| | | |
|---|---|---|
| 2003/0006859 A1 | 1/2003 | Taniguchi |
| 2011/0234295 A1 | 9/2011 | Uejima et al. |
| 2012/0086524 A1* | 4/2012 | Komura ................. H03H 9/725 333/195 |

FOREIGN PATENT DOCUMENTS

| | | |
|---|---|---|
| JP | 2002-330054 A | 11/2002 |
| JP | 2004-153414 A | 5/2004 |
| JP | 2005-20154 A | 1/2005 |
| JP | 2008-10995 A | 1/2008 |
| JP | 2011-077723 A | 4/2011 |

OTHER PUBLICATIONS

Google Machine English Translation of JP2005020154A, Oct. 20, 2015.*
Official Communication issued in corresponding Japanese Patent Application No. 2013-02100, mailed on Dec. 24, 2014.

* cited by examiner

*Primary Examiner* — Benny Lee
*Assistant Examiner* — Jorge Salazar, Jr.
(74) *Attorney, Agent, or Firm* — Keating & Bennett, LLP

(57) ABSTRACT

A high-frequency module includes a multilayer substrate, a switch IC, a SAW duplexer and a matching circuit. The matching circuit includes a wiring line and first and second inner layer ground electrodes. The matching circuit performs impedance matching between the switch IC and the SAW duplexer in a pass band of the SAW duplexer. The wiring line is an inner layer electrode of the multilayer substrate that is connected between the switch IC and the SAW duplexer. The first and second inner layer ground electrodes face the wiring line in a stacking direction with only dielectric layers of the multilayer substrate therebetween.

15 Claims, 10 Drawing Sheets

HIGH-FREQUENCY MODULE

BACKGROUND OF THE INVENTION

1. Field of the Invention

The present invention relates to high-frequency modules used in, for example, antenna front ends of wireless communication devices.

2. Description of the Prior Art

An antenna front end of a wireless communication device may be formed as a high-frequency module in which a switch IC, a SAW filter (SAW duplexer), a matching circuit and so forth are provided in a multilayer substrate (refer to, for example, Japanese Unexamined Patent Application Publication No. 2011-77723).

FIG. 10 is a circuit diagram for explaining an example of a high-frequency module of the prior art.

A high-frequency module 101 illustrated in FIG. 10 includes a switch IC 102, an antenna matching circuit 103, a transmission filter circuit 104, a transmission filter circuit 105, a SAW duplexer 106, a matching circuit 107, a SAW duplexer 108 and a matching circuit 109.

The high-frequency module 101 transmits and receives transmission signals and reception signals corresponding to a plurality of communication systems by commonly using a single antenna. The switch IC 102 has an antenna connection port PsA and connection switching ports PsS1, PsS2, PsS3 and PsS4. The switch IC 102 performs switching to connect any of the connection switching ports PsS1, PsS2, PsS3 and PsS4 to the antenna connection port PsA. The antenna matching circuit 103 is connected to the switch IC 102 via the antenna connection port PsA and performs impedance matching between the antenna and the switch IC 102. The transmission filter circuit 104 is connected to the switch IC 102 via the connection switching port PsS1 and allows a signal of a transmission band of a certain communication system to pass therethrough. The transmission filter circuit 105 is connected to the switch IC 102 via the connection switching port PsS2 and allows a signal of a transmission band of a certain communication system to pass therethrough. The SAW duplexer 106 is connected to the switch IC 102 via the connection switching port PsS3 and is composed of two SAW filters having different pass bands to each other. The matching circuit 107 is connected between the SAW duplexer 106 and the switch IC 102 and performs impedance matching in a band corresponding to the SAW duplexer 106. The SAW duplexer 108 is connected to the switch IC 102 via the connection switching port PsS4 and is composed of two SAW filters having different pass bands to each other. The matching circuit 109 is connected between the SAW duplexer 108 and the switch IC 102 and performs impedance matching in a band corresponding to the SAW duplexer 108. The matching circuit 107 and the matching circuit 109 are each formed of a single inductor. Each of these inductors is connected in parallel with the respective signal line and has one end thereof connected to ground.

In the case where a matching circuit is formed by connecting an inductor in parallel with a signal line as in the above-described high-frequency module, the SAW duplexer exhibits a high-pass attenuation characteristic in which attenuation in a band lower than the pass band is comparatively large and attenuation in a band higher than the pass band is comparatively small when seen from the switch IC side. Consequently, sometimes a harmonic of a reception signal cannot be sufficiently attenuated and intermodulation distortion is generated by the reception signal and the harmonic in the SAW duplexer and a circuit connected downstream of the SAW duplexer.

Therefore, giving the SAW duplexer a low-pass attenuation characteristic in which attenuation in a band higher than the pass band is comparatively large and attenuation in a band lower than the pass band is comparatively small when seen from the switch IC side has been considered. Accordingly, the matching circuit may have a configuration in which a capacitor is connected in parallel with a signal line. However, in such a case, when the capacitor is formed by providing a pair of coupling electrodes, it is necessary to secure a space in which to arrange the pair of coupling electrodes inside a multilayer substrate and as a result, the size of the substrate has sometimes been increased.

In addition, for example, the inductor and capacitor forming the matching circuit and a wiring line that is connected to the matching circuit are formed as inner layer electrodes in the multilayer substrate, and degradation of isolation characteristics and generation of intermodulation distortion has sometimes occurred due to the inner layer electrodes that form the matching circuit coupling with an inner layer electrode connected to another signal line.

Moreover, the wiring line connected to the matching circuit cannot be lengthened without limit due to the generation of loss, degradation of the Q value and also the generation of a signal phase shift in the wiring line. Consequently, when designing the matching circuit, it has been necessary to decide the arrangement and values of other circuit elements with consideration of the length and arrangement of the wiring line, and as a result, there have been large restrictions imposed on the design and the design work has been difficult.

SUMMARY OF THE INVENTION

Accordingly, preferred embodiments of the present invention provide a high-frequency module in which harmonics are attenuated without incurring an increase in substrate size, in which coupling between an inner layer electrode connected to another signal line and a matching circuit is significantly reduced or prevented and in which restrictions on the design of a matching circuit due to a wiring line are small.

A high-frequency module according to a preferred embodiment of the present invention includes a multilayer substrate, a switch circuit, a filter circuit and a matching circuit. The matching circuit includes a wiring line and a coupling electrode. The multilayer substrate includes a plurality of insulating layers stacked on top of one another in a stacking direction, and inner layer electrodes provided between the insulating layers. The switch circuit includes an antenna connection terminal and a plurality of connection switching terminals. The filter circuit is connected to one of the connection switching terminals of the switch circuit. The matching circuit performs impedance matching between the switch circuit and the filter circuit in a band that corresponds to the filter circuit. The wiring line is one of the inner layer electrodes and is connected between the switch circuit and the filter circuit. The coupling electrode is one of the inner layer electrodes, is connected to ground and is capacitively coupled with the wiring line as a result of facing the wiring line in the stacking direction with only an insulating layer therebetween.

In this configuration, in the matching circuit, a capacitor defined by the wiring line and the coupling electrode is connected in parallel with the wiring line and one end of this capacitor is connected to ground. As a result, the filter circuit has a low-pass attenuation characteristic, when viewed from the switch circuit, in which a harmonic of a signal of a corresponding band is attenuated. Moreover, since the wiring line defines one of the electrodes of the capacitor, additional space required to accommodate the capacitor is reduced to the minimum. In addition, the wiring line is shielded from inner layer electrodes connected to other signal lines by the coupling electrode connected to ground and therefore, coupling of an inner layer electrode connected to another signal line with the matching circuit is prevented. In addition, the wiring line defines a portion of the capacitor and therefore loss, Q value degradation, generation of signal phase shift and so forth due to the wiring line are prevented.

In the above-described high-frequency module, the matching circuit may include an inductor portion that is connected in series with one end of the wiring line.

In the above-described high-frequency module, the coupling electrode may include an opening portion in a portion of an area thereof that faces the wiring line. In this way, it is possible to perform adjustment to lower the capacitance of the capacitor defined by the wiring line and the coupling electrode.

In the above-described high-frequency module, it is preferable that the coupling electrode be provided on both sides of the wiring line in the stacking direction. In this way, the capacitance of a capacitor defined by the wiring line and the coupling electrodes is increased and both sides of the wiring line are shielded by a coupling electrode and therefore, coupling of inner layer electrodes connected to other signal lines with the matching circuit are prevented with more certainty.

In the above-described high-frequency module, it is preferable that only the wiring line be provided between the coupling electrodes. In addition, it is preferable that the wiring line be closer to the coupling electrodes than the other inner layer electrodes are.

In the above-described high-frequency module, it is preferable that the filter circuit be provided in a plurality, that the matching circuit be provided in a plurality, that at least one of the filter circuits be connected to the matching circuit defined by the wiring line and the coupling electrode, and that at least another one of filter circuits be connected to another one of the matching circuits defined by just an inductor. With this configuration, coupling between these filter circuits via a capacitor does not occur and isolation of the circuits is significantly improved.

According to various preferred embodiments of the present invention, by using a matching circuit, a low-pass attenuation characteristic in which a harmonic of a high-frequency signal in a band corresponding to a filter circuit is attenuated is provided and generation of intermodulation distortion is prevented. In addition, an increase in substrate size is prevented by reducing to a minimum a space in which a wiring line and a coupling electrode are arranged. In addition, coupling of an inner layer electrode connected to another signal line with the matching circuit is prevented and as a result, good isolation characteristics are realized. Furthermore, loss, Q value degradation, signal phase shift and so forth due to the wiring line are prevented, such that restrictions on the line length of the wiring line are eliminated and the work of designing the matching circuit is simplified.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

First, a high-frequency module according to a first preferred embodiment of the present invention will be described.

Figure 1A:
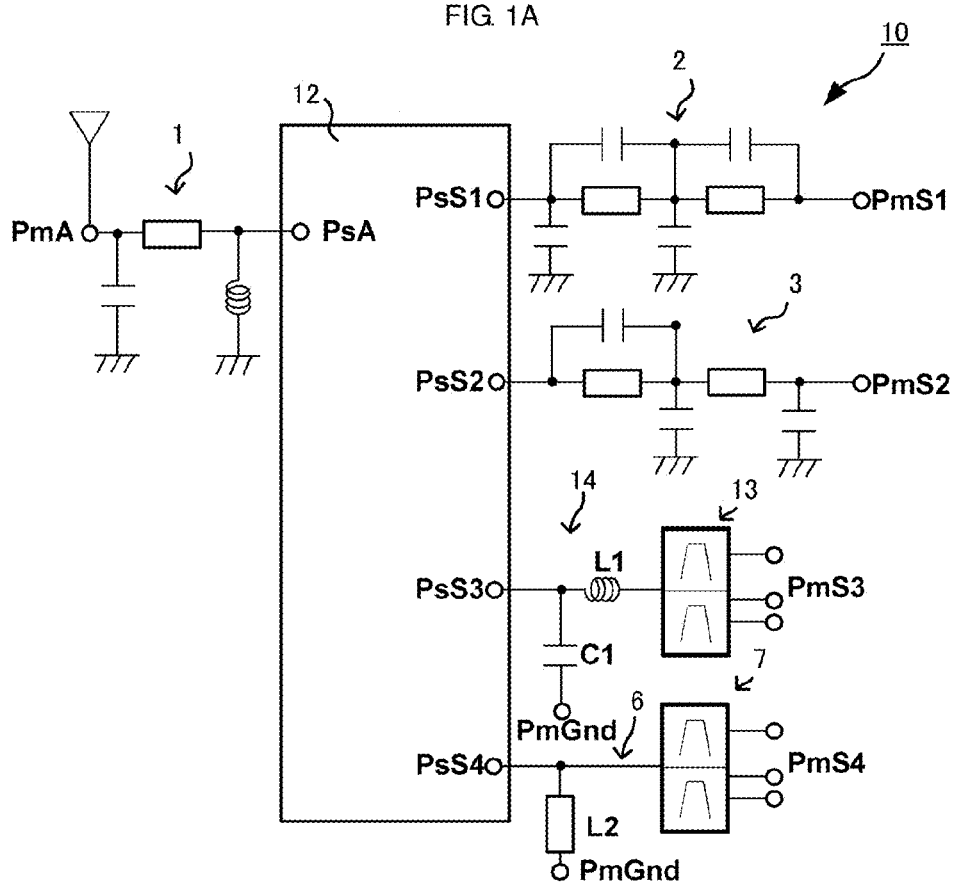
FIG. 1A and FIG. 1B are a schematic circuit diagram and a schematic sectional view of a high-frequency module according to a first preferred embodiment of the present invention, respectively.
Figure 1B:
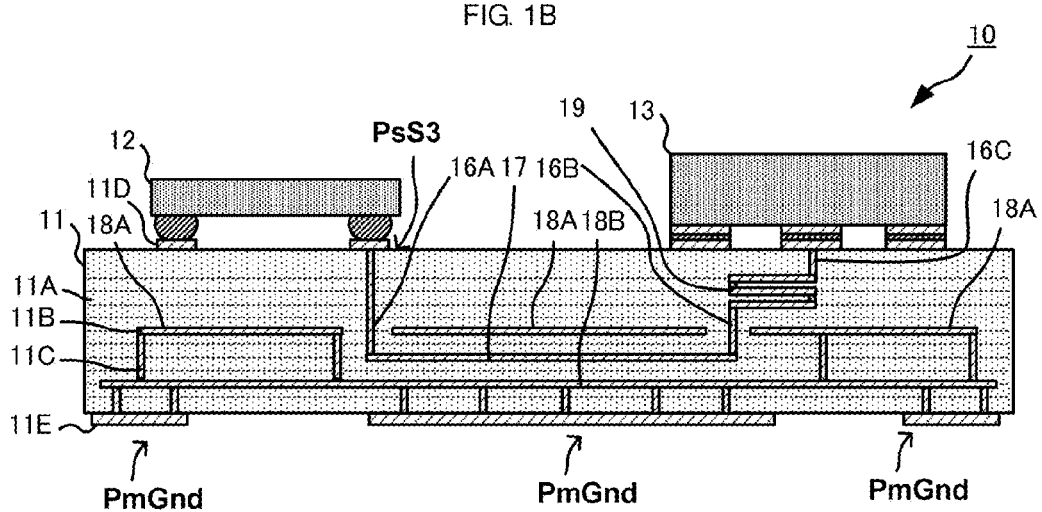

FIG. 1A is a schematic circuit diagram of the high-frequency module according to the first preferred embodiment. FIG. 1B is a schematic sectional view of the high-frequency module according to the first preferred embodiment. In the following description, a surface that faces upward in the sectional view of the high-frequency module will be referred to as an upper surface and a surface that faces downward in the sectional view of the high-frequency module will be referred to as a lower surface.

A high-frequency module 10 illustrated in FIG. 1A includes a switch IC 12, an antenna matching circuit 1, a transmission filter circuit 2, a transmission filter circuit 3, a SAW duplexer 13, a matching circuit 14, a SAW duplexer 7 and a matching circuit 6. The high-frequency module 10 transmits and receives transmission signals and reception signals corresponding to a plurality of communication systems by commonly using a single antenna.

The high-frequency module 10 includes an antenna connection port PmA, connection switching ports PmS1, PmS2, PmS3 and PmS4, and a ground connection port PmGnd. The antenna connection port PmA is connected to an antenna. The connection switching port PmS1 is connected to a first transmission circuit, which is not illustrated. The connection switching port PmS2 is connected to a second transmission circuit, which is not illustrated. The connection switching ports PmS3 are connected to a first reception circuit and a second reception circuit, which are not illustrated. The connection switching ports PmS4 are connected to a third reception circuit and a fourth reception circuit, which are not illustrated. The ground connection port PmGnd is connected to ground.

In addition, the switch IC 12 includes an antenna connection port PsA and connection switching ports PsS1, PsS2, PsS3 and PsS4. The switch IC 12 has a function of performing switching to connect any of the connection switching ports PsS1, PsS2, PsS3 and PsS4 to the antenna connection port PsA. The antenna matching circuit 1 is connected between the antenna connection port PmA and the antenna connection port PsA and performs impedance matching between the antenna and the switch IC 12. The transmission filter circuit 2 is connected between the connection switching port PmS1 and the connection switching port PsS1 and allows a signal of a transmission band of a certain communication system to pass therethrough. The transmission filter circuit 3 is connected between the connection switching port PmS2 and the connection switching port PsS2 and allows a signal of a transmission band of a certain communication system to pass therethrough. The SAW duplexer 13 is connected between the connection switching ports PmS3 and the connection switching port PsS3 and includes two SAW filters having different pass bands to each other. A SAW filter of the SAW duplexer 13 on the reception circuit side is equipped with balanced terminals. The matching circuit 14 is connected between the SAW duplexer 13 and the connection switching port PsS3 of the switch IC 12 and performs impedance matching in a band corresponding to the SAW duplexer 13. The SAW duplexer 7 is connected between the connection switching ports PmS4 and the connection switching port PsS4 and includes two SAW filters having different pass bands to each other. A SAW filter of the SAW duplexer 7 on the reception circuit side is equipped with balanced terminals. The matching circuit 6 is connected between the SAW duplexer 7 and the connection switching port PsS4 of the switch IC 12 and performs impedance matching in a band corresponding to the SAW duplexer 7.

Here, the matching circuit 14 preferably includes an inductor L1 and a capacitor C1. The inductor L1 is connected in series between the SAW duplexer 13 and the connection switching port PsS3 of the switch IC 12. The capacitor C1 is connected in parallel with the inductor L1 and one end thereof is connected to the switch IC 12 side of the inductor L1 and the other end thereof is connected to ground. The SAW duplexer 13 is connected to the switch IC 12 via the matching circuit 14 having the above described circuit configuration, and therefore the attenuation characteristic on the SAW duplexer 13 side seen from the connection switching port PsS3 of the switch IC 12 is a low pass attenuation characteristic in which attenuation in a band that is lower than the passband of the SAW duplexer 13 is comparatively small and attenuation in a band that is higher than the passband is comparatively large. Therefore, a harmonic of a reception signal does not pass through the connection switching ports PmS3 of the high-frequency module 10 and generation of intermodulation distortion due to a reception signal and a harmonic is prevented from occurring in reception circuits connected downstream of the connection switching ports PmS3 and in the SAW duplexer 13.

The matching circuit 6 preferably includes a single inductor L2. The inductor L2 is connected in parallel with a signal line, one end of the inductor L2 being connected to the signal line and the other end of the inductor L2 being connected to ground. The SAW duplexer 7 is connected to the switch IC 12 via the matching circuit 6 having the above-described circuit configuration, and therefore the attenuation characteristic on the SAW duplexer 7 side seen from the connection switching port PsS4 of the switch IC 12 is a high-pass attenuation characteristic in which attenuation in a band that is lower than the passband of the SAW duplexer 7 is comparatively large and attenuation in a band that is higher than the passband is comparatively small. Therefore, there is a risk of a harmonic of a reception signal passing through to reception circuits connected downstream of the connection switching ports PmS4 of the high-frequency module 10. However, the matching circuit 6 includes the single inductor L2, different from the matching circuit 14 and therefore coupling of the matching circuit 6 and the matching circuit 14 via a capacitor and a ground is prevented and isolation of the matching circuit 6 and the matching circuit 14 from each other is high.

In addition, as illustrated in FIG. 1B, the high-frequency module 10 includes a multilayer substrate 11. The multilayer substrate 11 includes a plurality of dielectric layers 11A, which are insulating layers, inner layer electrodes 11B, via electrodes 11C, upper surface electrodes 11D and lower surface electrodes 11E. The plurality of dielectric layers 11A are stacked on top of one another with the vertical direction being a stacking direction. The inner layer electrodes 11B are provided between the dielectric layers 11A. The via electrodes 11C are provided so as to penetrate through the dielectric layers 11A in the vertical direction and connect the electrodes provided above and below the dielectric layers 11A to one another. The upper surface electrodes 11D are provided on an upper surface of the multilayer substrate 11. The lower surface electrodes 11E are provided on the lower surface of the multilayer substrate 11.

In addition, the upper surface electrodes 11D are used to mount a plurality of chip components. The switch IC 12, the SAW duplexer 13 and the SAW duplexer 7 (not illustrated) are included in the plurality of chip components. Therefore, each of the ports including the connection switching port PsS3 of the switch IC 12 is connected to a corresponding one of the upper surface electrodes 11D including upper surface electrodes 11D that are not illustrated.

The lower surface electrodes 11E are mounted on to an external circuit. Therefore, each of the ports including the ground connection port PmGnd of the high-frequency module 10 corresponds to one of the lower surface electrodes 11E including lower surface electrodes 11E that are not illustrated.

In addition, the multilayer substrate 11 includes a via wiring line 16A, a wiring line 17, a via wiring line 16B, an inductor portion 19, a via wiring line 16C and inner layer ground electrodes 18A and 18B. The via wiring line 16A, the wiring line 17, the via wiring line 16B, the inductor portion 19, the via wiring line 16C and the inner layer ground electrodes 18A and 18B form the above-mentioned matching circuit 14 and are connected between the switch IC 12 and the SAW duplexer 13. The inductor portion 19 defines the above-mentioned inductor L1. In addition, the wiring line 17 and the inner layer ground electrodes 18A and 18B define the above-mentioned capacitor C1.

More specifically, the inner layer ground electrodes 18A and 18B are provided at different interfaces between dielectric layers 11A and the inner layer ground electrode 18A is positioned further toward the upper surface side than the inner layer ground electrode 18B.

The via wiring line 16C includes a via electrode 11C provided so as to extend through a plurality of dielectric layers 11A, is positioned further toward the upper surface side than the inner layer ground electrode 18A and is provided so as to extend in the vertical direction directly below an upper surface electrode 11D on which the SAW duplexer 13 is mounted, one end thereof being connected to the upper surface electrode 11D.

The inductor portion 19 preferably is formed in a coil shape by connecting a plurality of inner layer electrodes 11B and via electrodes 11C to each other. The inductor portion 19 is positioned further toward the upper surface side than the inner layer ground electrode 18A and further toward the lower surface side than the via wiring line 16C and one end thereof is connected to the via wiring line 16C.

The via wiring line 16B includes a via electrode 11C provided so as to extend through a plurality of dielectric layers 11A and is provided so as to extend in the vertical direction directly below the inductor portion 19. One end of the via wiring line 16B is connected to the inductor portion 19 and the other end of the via wiring line 16B extends to a point between dielectric layers 11A interposed between the inner layer ground electrode 18A and the inner layer ground electrode 18B.

The via wiring line 16A includes a via electrode 11C provided so as to extend through a plurality of dielectric layers 11A, is provided so as to extend in the vertical direction directly below the upper surface electrode 11D on which the connection switching port PsS3 of the switch IC 12 is mounted, and one end thereof is connected to the upper surface electrode 11D. In addition, the other end of the via wiring line 16A extends to a point between dielectric layers 11A interposed between the inner layer ground electrode 18A and the inner layer ground electrode 18B.

The wiring line 17 is one of the inner layer electrodes 11B. That is, the wiring line 17 is defined by an inner layer electrode 11B, is provided between dielectric layers 11A interposed between the inner layer ground electrode 18A and the inner layer ground electrode 18B, and is connected between the via wiring line 16A and the via wiring line 16B. The inner layer ground electrode 18A and the inner layer ground electrode 18B oppose each other on either side of the wiring line 17 with just dielectric layers 11A therebetween, that is, are capacitively coupled with each other as a result of being superposed with each other when viewed in plan and correspond to the coupling electrodes in the description of the claims. The inner layer ground electrode 18A and the inner layer ground electrode 18B are also each one of the inner layer electrodes 11B. That is, the inner layer ground electrode 18A and the inner layer ground electrode 18B are each defined by an inner layer electrode 11B.

Thus, the wiring line 17 defines one electrode of the capacitor C1 and the inner layer ground electrodes 18A and 18B define the other electrode of the capacitor C1, such that the space in which to arrange the capacitor C1 is reduced to a minimum. Therefore, an increase in the size of the multilayer substrate 11 is prevented and a compact high-frequency module 10 is provided.

In addition, the wiring line 17 is interposed between the inner layer ground electrodes 18A and 18B and as a result the wiring line 17 is shielded from other inner layer electrodes connected to the above-mentioned connection switching ports PsS1, PsS2, PsS4 and so forth. Therefore, coupling of the wiring line 17 with other inner layer electrodes connected to the above-mentioned connection switching ports PsS1, PsS2, PsS4 and so forth is prevented and isolation characteristics are high.

In addition, since the wiring line 17 does not function as a normal wiring line but rather functions as part of the capacitor C1, even if the actual line length of the wiring line 17 is long, the substantial wiring line length between the switch IC 12 and the SAW duplexer 13 can be reduced. Thus, occurrence of loss, Q value degradation, a signal phase shift and so forth generated in a normal wiring line are significantly reduced or prevented. Thus, in design of the matching circuit 14, design restrictions due to the wiring line 17 are significantly reduced, the degree of freedom regarding the arrangement of and setting of the value of the inductor portion 19 is significantly increased and the design work becomes easier. Here, the capacitance of the capacitor C1 can be adjusted by changing the line width of the wiring line 17.

Figure 2:
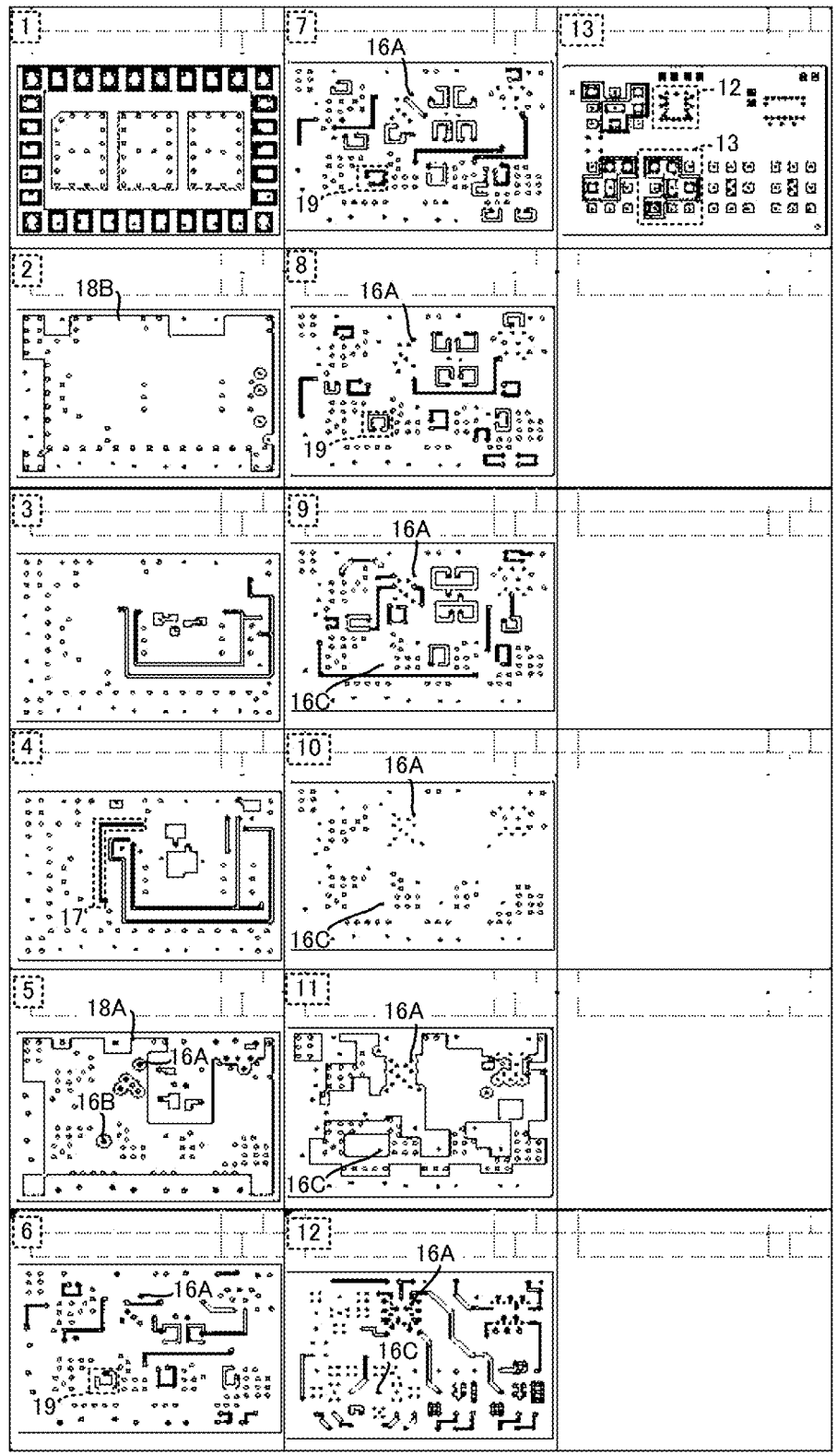
FIG. 2 is a layer diagram for an example of the high-frequency module according to the first preferred embodiment of the present invention.

Next, a specific example of the high-frequency module according to the first preferred embodiment will be described. FIG. 2 is a layer diagram of a high-frequency module according to the example. Portions (1) to (13) in FIG. 2 illustrate the shapes of lower surface electrodes, inner layer electrodes and upper surface electrodes of the high-frequency module according to the example in order from the lower surface side of the multilayer substrate. The wiring line structure and circuit structure between the switch IC 12 and the SAW duplexer 13 of the high-frequency module according to this example are similar to those illustrated in FIGS. 1A and 1B, but some portions of the circuit structure and the multilayer structure are different from those illustrated in FIGS. 1A and 1B.

Lower surface electrodes are provided on the first layer from the lower surface of the multilayer substrate. The inner layer ground electrode 18B is provided on the second layer from the lower surface of the multilayer substrate. The wiring line 17 is provided on the fourth layer from the lower surface of the multilayer substrate. The inner layer ground electrode 18A is provided on and the via wiring lines 16A and 16B are exposed in the fifth layer from the lower surface of the multilayer substrate. A portion of the inductor portion 19 is provided on and the via wiring line 16A is exposed in each of the layers from the sixth layer to the eighth layer from the lower surface of the multilayer substrate. The via wiring lines 16A and 16C are exposed in each of the layers from the ninth layer to the twelfth layer from the lower surface of the multilayer substrate. A plurality of upper surface electrodes including the upper surface electrodes on which the switch IC 12 is to be mounted and the upper surface electrodes on which the SAW duplexer 13 is to be mounted are provided on the thirteenth layer from the lower surface of the multilayer substrate.

That is, the wiring line 17, which is provided on the fourth layer from the lower surface of the multilayer substrate, is interposed between the inner layer ground electrode 18B, which is provided on the second layer from the lower surface of the multilayer substrate, and the inner layer ground electrode 18A, which is provided on the fifth layer from the lower surface of the multilayer substrate, and is connected between the via wiring line 16A and the via wiring line 16B.

The via wiring line 16A includes only a via electrode extending from the fourth layer to the thirteenth layer from the lower surface of the multilayer substrate and is connected to an upper surface electrode on which the switch IC 12 is mounted on the thirteenth layer from the lower surface of the multilayer substrate.

The via wiring line 16B includes only a via electrode extending from the fourth layer to the sixth layer from the lower surface of the multilayer substrate and is connected to the inductor portion 19 at the sixth layer from the lower surface of the multilayer substrate.

In addition, the via wiring line 16C includes only a via electrode extending from the ninth layer to the thirteenth layer from the lower surface of the multilayer substrate, is connected to the inductor portion 19 at the ninth layer from the lower surface of the multilayer substrate and is connected to an upper surface electrode on which the SAW duplexer 13 is mounted on the thirteenth layer from the lower surface of the multilayer substrate.

Figure 3:
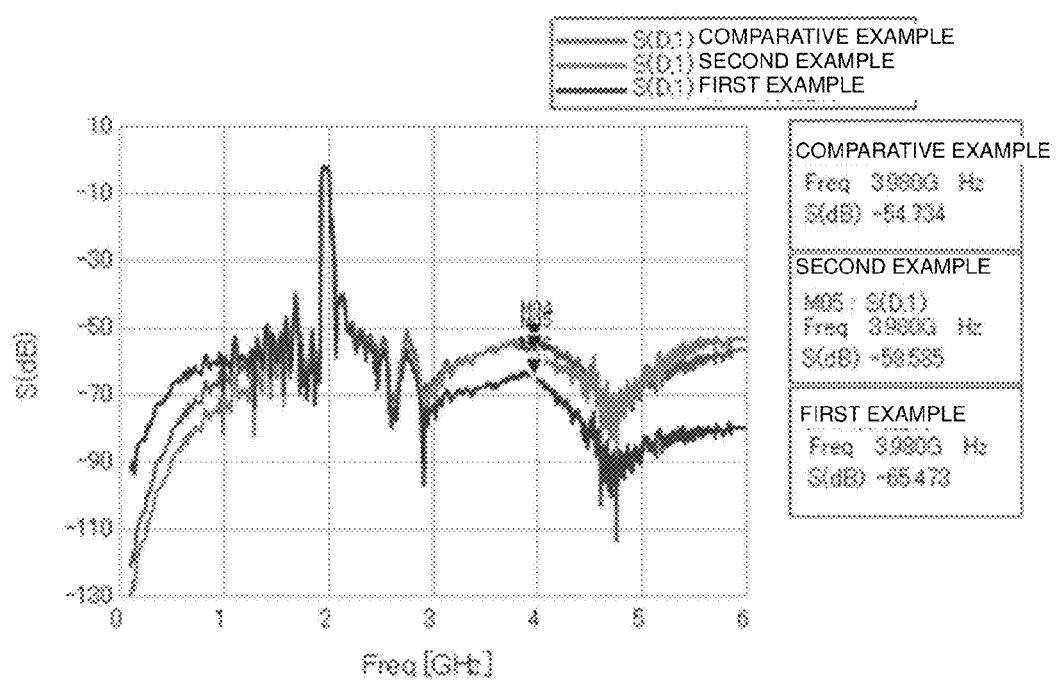
FIG. 3 is a diagram for explaining changes in an attenuation characteristic in examples of the high-frequency module and in a comparative example configuration.

Next, changes in the attenuation characteristic that occur when a portion of the matching circuit of the high-frequency module according to the above-described example is changed will be described. FIG. 3 illustrates attenuation characteristics seen when looking toward the SAW duplexer 13 side from the connection switching port PsS3 of the switch IC 12 in the high-frequency module according to the above-described example (first example), a high-frequency module according to a second example, and a high-frequency module according to a comparative example.

The first example has a circuit configuration that includes a matching circuit including an inductor L1 connected in series with a signal line and a capacitor C1 connected in parallel with the signal line, similarly to as in the high-frequency module whose configuration is illustrated in FIG. 2. The second example has a circuit configuration that includes a matching circuit includes a single capacitor C1 connected in parallel with a signal line. The comparative example has a circuit configuration that includes a matching circuit that is not formed of a capacitor connected in parallel with the signal line but rather includes a single inductor connected in parallel with a signal line.

In addition, here, an attenuation characteristic in a single SAW filter that defines part of the SAW duplexer 13 is illustrated. This SAW filter preferably has a pass band in an approximately 1900 MHz band, for example.

The comparative example exhibits a high-pass attenuation characteristic in which attenuation in a band lower than the pass band is large and attenuation in a band higher than the pass band is small. In contrast, both the first and second examples exhibit a high pass attenuation characteristic in which attenuation in a band lower than the pass band is smaller and attenuation in a band higher than the pass band is larger than in the comparative example.

More specifically, at the frequency of a second order harmonic of the SAW filter, greater attenuation is obtained in the first and second examples than in the comparative example in that attenuation in the first example is approximately −65.5 dB and attenuation in the second example is approximately −58.6 dB whereas attenuation in the comparative example is approximately −54.7 dB.

Therefore, it is clear that attenuation of the second order harmonic in the pass band can be increased and generation of intermodulation distortion can be significantly reduced or prevented by realizing a high-pass attenuation characteristic such as those of the first example and the second example rather than the high-pass attenuation characteristic of the comparative example.

Next, a high-frequency module according to a second preferred embodiment of the present invention will be described.

Figure 4A:
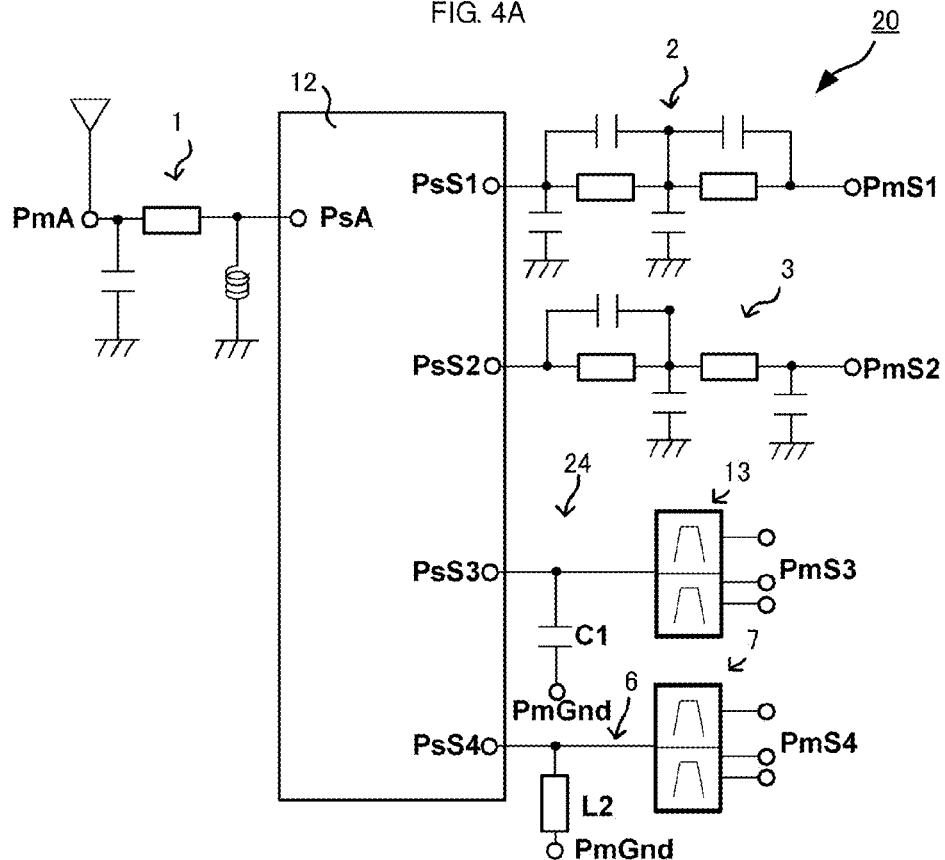
FIG. 4A and FIG. 4B are a schematic circuit diagram and a schematic sectional view of a high-frequency module according to a second preferred embodiment of the present invention, respectively.
Figure 4B:
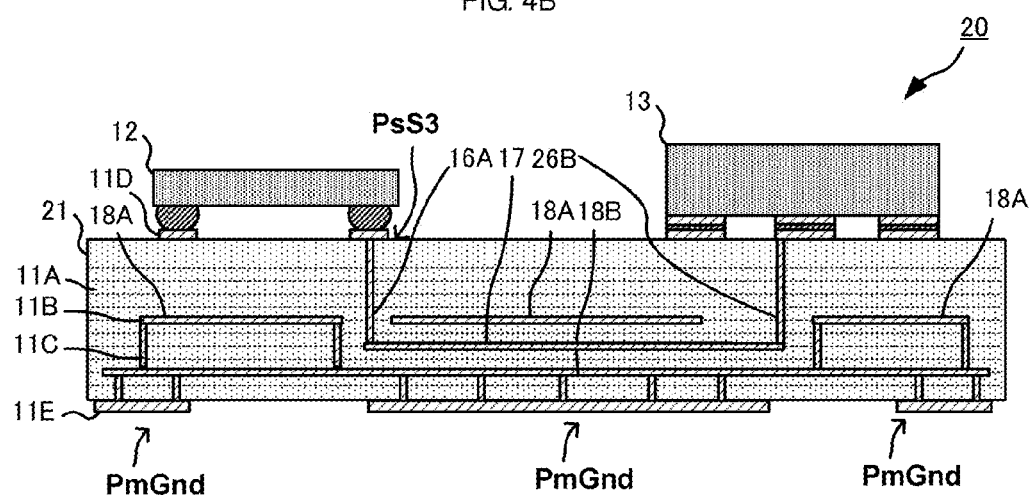

FIG. 4A is a schematic circuit diagram of the high-frequency module according to the second preferred embodiment of the present invention. FIG. 4B is a schematic sectional view of the high-frequency module according to the second preferred embodiment of the present invention.

A high-frequency module 20 illustrated in FIG. 4A includes a switch IC 12, an antenna matching circuit 1, a transmission filter circuit 2, a transmission filter circuit 3, a SAW duplexer 13, a matching circuit 24, a SAW duplexer 7 and a matching circuit 6.

The matching circuit 24 has a different configuration to that described in the first preferred embodiment and is composed of just a capacitor C1. That is, the matching circuit has a configuration realized by omitting the inductor connected in series with the signal line from the configuration of the first preferred embodiment.

In addition, as illustrated in FIG. 4B, the high-frequency module 20 includes a multilayer substrate 21. The multilayer substrate 21 has a configuration obtained by omitting the inductor portion and the via wiring line connected to the inductor portion described in the first preferred embodiment and replacing them with a via wiring line 26B. The via wiring line 26B is provided so as to extend vertically directly under an upper surface electrode 11D on which the SAW duplexer 13 is mounted.

The configuration of the high-frequency module 20 is similar to that of the second example whose attenuation characteristic is illustrated in FIG. 3. That is, the inductor connected in series with the signal line is omitted and the matching circuit includes only a capacitor connected in parallel with the signal line. Also in the case of such a configuration, the attenuation characteristic on the SAW duplexer side seen from a connection point between the matching circuit and the switch circuit can be made to be a low-pass attenuation characteristic in which attenuation in a band that is higher than the pass band of the SAW duplexer is comparatively large.

Next, a high-frequency module according to a third preferred embodiment of the present invention will be described.

Figure 5:
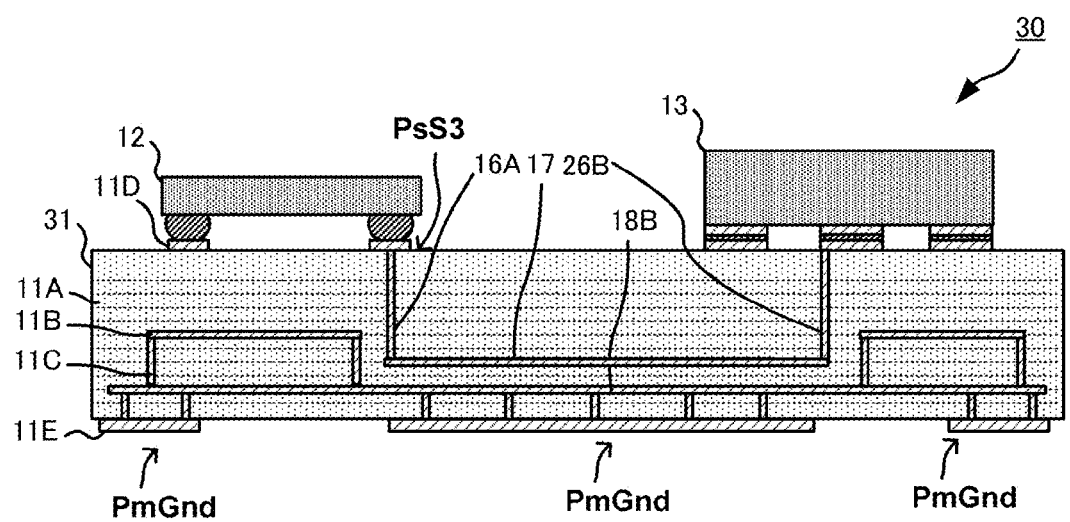
FIG. 5 is a schematic sectional view of a high-frequency module according to a third preferred embodiment of the present invention.

FIG. 5 is a schematic sectional view of a high-frequency module according to the third preferred embodiment of the present invention.

A high-frequency module 30 illustrated in FIG. 5 includes a multilayer substrate 31. The multilayer substrate 31 has a configuration obtained by omitting the inner layer ground electrode positioned above the wiring line 17 from among the two inner layer ground electrodes illustrated in the first and second preferred embodiments. The matching circuit in the thus-configured high-frequency module 30 includes only a capacitor defined by the inner layer ground electrode 18B and the wiring line 17 facing each other and is therefore suitable for a case in which it is desirable to reduce the capacitance of the capacitor connected in parallel with the signal line.

Next, a high-frequency module according to a fourth preferred embodiment of the present invention will be described.

Figure 6:
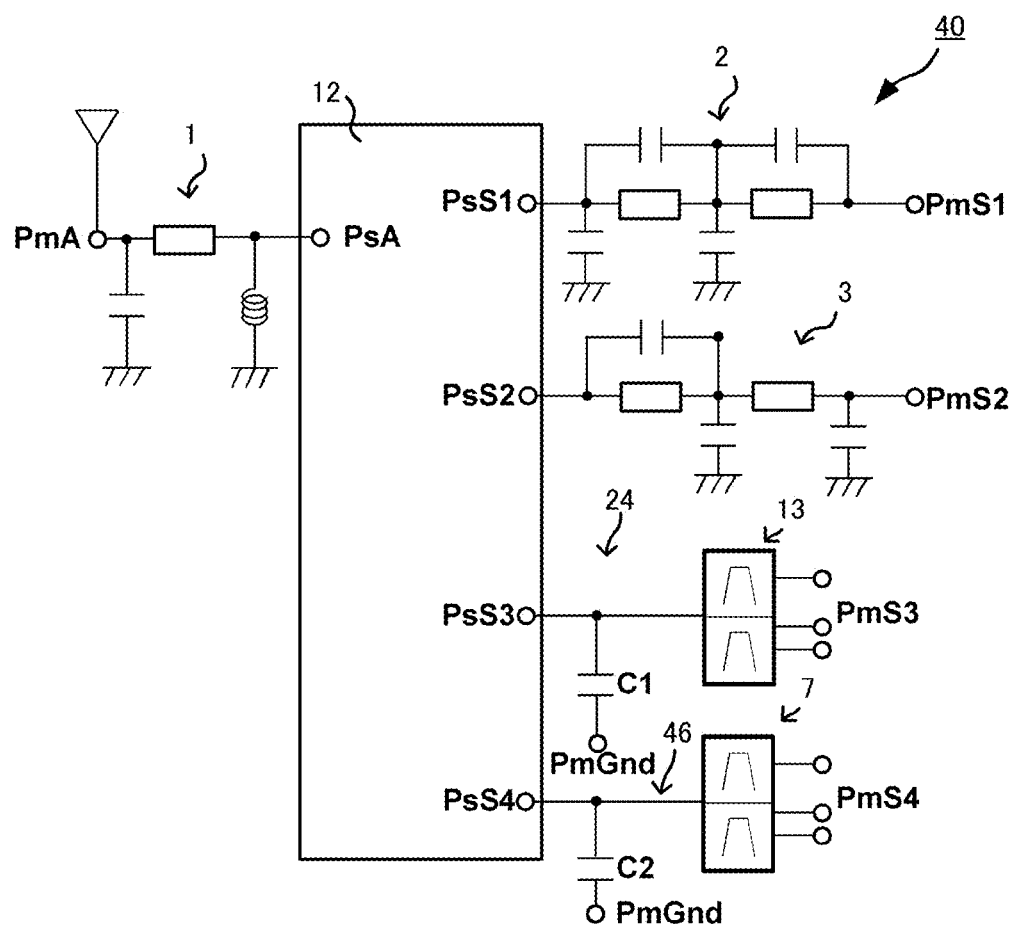
FIG. 6 is a schematic circuit diagram of a high-frequency module according to a fourth preferred embodiment of the present invention.

FIG. 6 is a schematic circuit diagram of the high-frequency module according to the fourth preferred embodiment of the present invention.

A high-frequency module 40 illustrated in FIG. 6 includes a matching circuit 46. The matching circuit 46 is connected to the connection switching port PsS4 of the switch IC 12 and includes just a capacitor C2 connected in parallel with the signal line. That is, the matching circuit 46 is configured similarly to the matching circuit 24, which is connected to the connection switching port PsS3 of the switch IC 12. In the case of the thus-configured high-frequency module 40, not only is the attenuation characteristic seen when looking toward the SAW duplexer 13 side from the connection switching port PsS3 a low-pass attenuation characteristic, but the attenuation characteristic seen when looking toward the SAW duplexer 7 side from the connection switching port PsS4 is also a low-pass attenuation characteristic and therefore, also for a reception signal from the connection switching port PsS4, attenuation in a band that is higher than a required pass band is made large and harmonics of the reception signal are greatly attenuated.

Next, a high-frequency module according to a fifth preferred embodiment of the present invention will be described.

Figure 7:
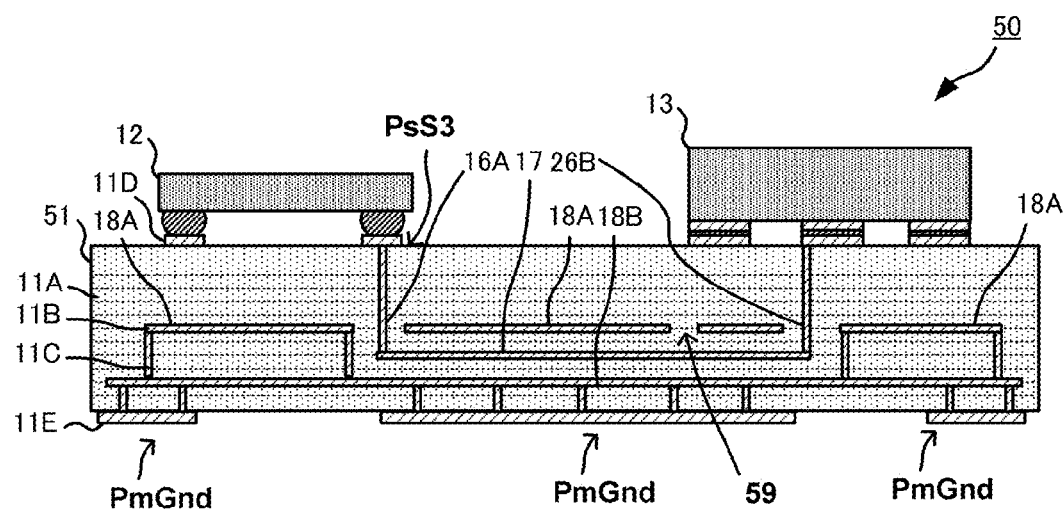
FIG. 7 is a schematic sectional view of a high-frequency module according to a fifth preferred embodiment of the present invention.

FIG. 7 is a schematic sectional view of the high-frequency module according to the fifth preferred embodiment of the present invention.

Figure 8:
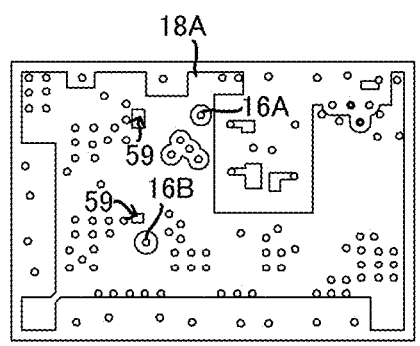
FIG. 8 is a layer diagram for an example of the high-frequency module according to the fifth preferred embodiment of the present invention.

A high-frequency module 50 illustrated in FIG. 7 includes a multilayer substrate 51. In the multilayer substrate 51, an opening portion 59 is provided in an inner layer ground electrode illustrated in the first to third preferred embodiments. FIG. 8 illustrates a portion of a layer diagram of the high-frequency module according to this preferred embodiment and illustrates only the fifth layer, which is different from that in FIG. 2. The opening portion 59 is provided in the fifth layer. In the thus-configured high-frequency module 50, the capacitance generated as a result of the inner layer ground electrodes 18A and 18B and the wiring line 17 facing each other can be reduced by adjusting the size of the opening portion 59.

Next, a high-frequency module according to a sixth preferred embodiment of the present invention will be described.

Figure 9:
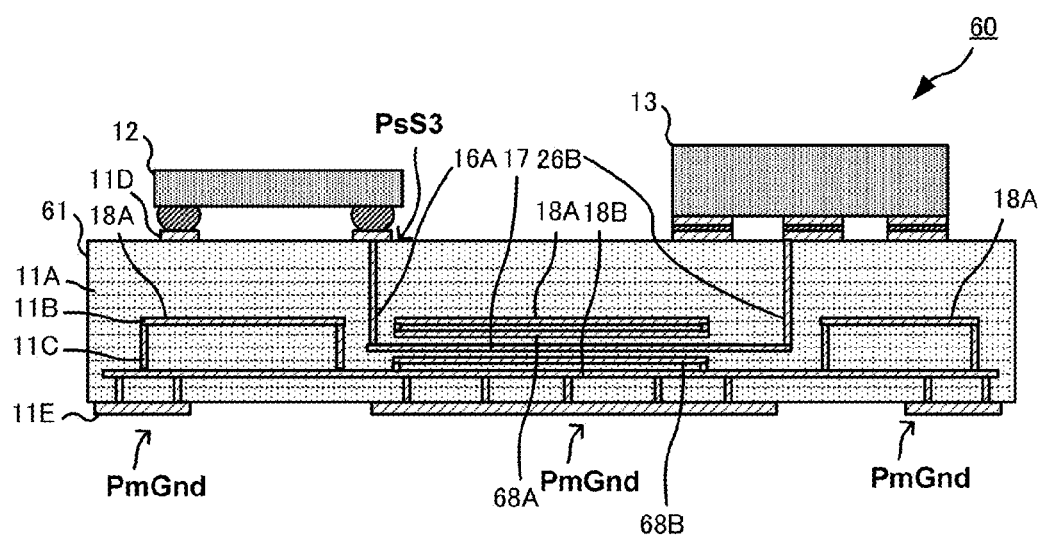
FIG. 9 is a schematic sectional view of a high-frequency module according to a sixth preferred embodiment of the present invention.
Figure 10:
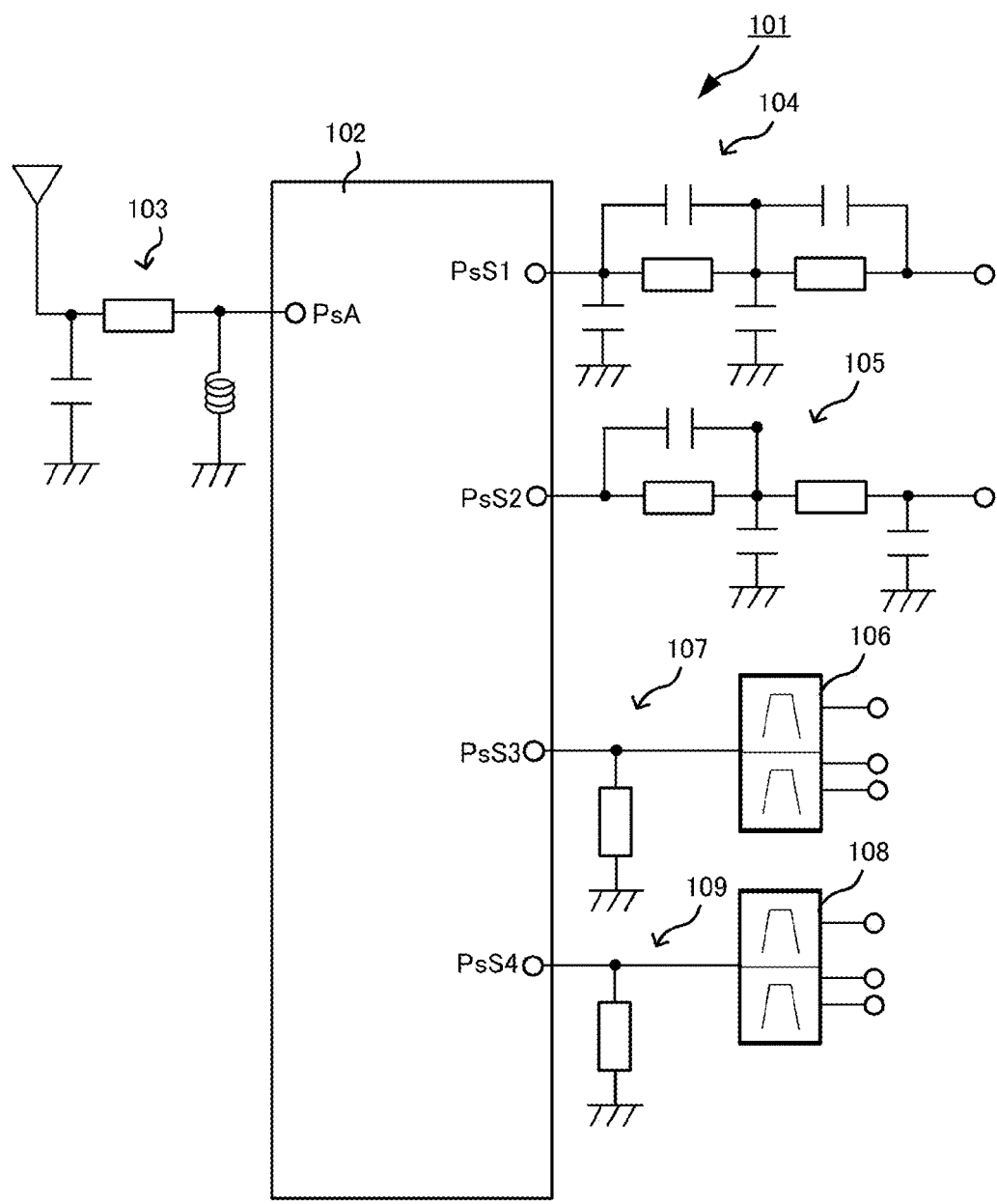
FIG. 10 is a schematic circuit diagram of a high-frequency module according to an example of the prior art.

FIG. 9 is a schematic sectional view of the high-frequency module according to the sixth preferred embodiment of the present invention.

A high-frequency module 60 illustrated in FIG. 9 includes a multilayer substrate 61. In the multilayer substrate 61, inner layer ground electrodes 68A and 68B are provided in addition to the inner layer ground electrodes illustrated in the first to third preferred embodiments and the fifth preferred embodiment. The inner layer ground electrodes 68A and 68B are provided at positions that are closer to the wiring line 17 than the inner layer ground electrodes 18A and 18B are, and only the wiring line 17 is interposed between the inner layer ground electrodes 68A and 68B. That is, among all of the signal lines, the wiring line 17 is arranged as to be closest to and face the inner layer ground electrodes 68A and 68B. With this configuration, the capacitance generated by the inner layer ground electrodes 68A and 68B and the wiring line 17 facing each other is increased.

A high-frequency module according to the present invention can be formed as has been described in the above preferred embodiments, but a high-frequency module according to the present invention may have other configurations. For example, in the above-described preferred embodiments, examples were described in which a switch IC is preferably used as a switch circuit, but instead a diode switch may be provided in the multilayer substrate as a switch circuit, for example. In addition, examples were described in which a SAW duplexer is preferably used as a filter circuit, but instead a single SAW filter or a filter including a passive element may be provided as a filter circuit, for example. In addition, the adjustable range of the capacitance can be broadened by changing the dielectric constants of the dielectric layer between the wiring line 17 and the inner layer ground electrodes and of the other dielectric layers. In addition, the insulating layers are not limited to being dielectric layers and other insulating layers such as magnetic layers can be used as the insulating layers.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A high-frequency module, comprising:
   a multilayer substrate including a plurality of insulating layers stacked on top of one another in a stacking direction, and inner layer electrodes provided between the insulating layers;
   a switch circuit including an antenna connection terminal and a plurality of connection switching terminals;
   a filter circuit connected to one of the connection switching terminals of the switch circuit; and
   a matching circuit that performs impedance matching between the switch circuit and the filter circuit in a band of the filter circuit; wherein
   the matching circuit includes:
      a wiring line that is one of the inner layer electrodes and is connected between the switch circuit and the filter circuit; and
      a coupling electrode that is another one of the inner layer electrodes, is connected to ground, and faces the wiring line in the stacking direction with at least one of the insulating layers therebetween and is capacitively coupled with the wiring line; and
   the coupling electrode is provided on both sides of the wiring line in the stacking direction.

2. The high-frequency module according to claim 1, wherein the matching circuit includes just one capacitor connected in parallel to a signal line, and the switch circuit includes a connection switching port connected to the matching circuit, the just one capacitor being defined by the coupling electrode, the wiring line, and the at least one of the insulating layers therebetween.

3. The high-frequency module according to claim 1, wherein the matching circuit includes an inductor portion connected in series with one end of the wiring line.

4. The high-frequency module according to claim 1, wherein the coupling electrode includes an opening portion therein in a portion of an area thereof that faces the wiring line.

5. The high-frequency module according to claim 1, wherein the multilayer substrate includes via hole conductors, via wiring lines and inner layer ground electrodes.

6. The high-frequency module according to claim 1, wherein the wiring line is the only inner electrode provided between portions of the coupling electrode.

7. The high-frequency module according to claim 1, wherein the wiring line is closer to the coupling electrode in the stacking direction than the other inner layer electrodes are.

8. The high-frequency module according to claim 1, wherein the filter circuit is provided in a plurality and the matching circuit is provided in a plurality, at least one of the plurality of filter circuits is connected to the matching circuit of the plurality of matching circuits including the wiring line and the coupling electrode, and at least another one of the plurality of filter circuits is connected to another one of the plurality of matching circuits including only an inductor.

9. The high-frequency module according to claim 1, further comprising at least one SAW duplexer.

10. The high-frequency module according to claim 1, further comprising two SAW duplexers.

11. The high-frequency module according to claim 1, further comprising an antenna matching circuit.

12. The high-frequency module according to claim 1, wherein the filter circuit includes at least one transmission filter circuit.

13. The high-frequency module according to claim 1, wherein the matching circuit includes an inductor and a capacitor connected in series, the capacitor being defined by the coupling electrode, the wiring line, and the at least one of the insulating layers therebetween.

14. The high-frequency module according to claim 1, wherein the matching circuit includes only one inductor.

15. The high-frequency module according to claim 1, wherein the matching circuit includes a capacitor and does not include an inductor, the capacitor being defined by the coupling electrode, the wiring line, and the at least one of the insulating layers therebetween.

\* \* \* \* \*